United States Patent [19]

Brandstetter et al.

[11] Patent Number: 4,771,397

[45] Date of Patent: Sep. 13, 1988

[54] METHOD AND APPARATUS FOR OPTICAL RF AMPLITUDE EQUALIZATION

[75] Inventors: Robert W. Brandstetter, Levittown; Adrian R. Doucette, Garden City, both of N.Y.

[73] Assignee: Grumman Aerospace Corporation, Bethpage, N.Y.

[21] Appl. No.: 857,288

[22] Filed: Apr. 30, 1986

[51] Int. Cl.[4] .............................................. G06G 9/00
[52] U.S. Cl. .................................... 364/807; 364/802
[58] Field of Search ............... 364/807, 602, 822; 324/77 K; 350/358, 162.12; 332/31 R, 16 R

[56] References Cited

U.S. PATENT DOCUMENTS

| 3,462,603 | 8/1969 | Gordon | 307/425 |
|---|---|---|---|
| 3,544,806 | 12/1970 | DeMaria et al. | 307/429 |
| 3,602,725 | 8/1971 | DeMaria | 307/429 |
| 3,742,375 | 6/1973 | Farah | 333/144 |
| 4,012,120 | 3/1977 | Kagiwada et al. | 364/822 |
| 4,066,333 | 1/1978 | Dargent | 340/802 X |
| 4,351,589 | 9/1982 | Chauel | 364/713 X |
| 4,365,310 | 12/1982 | Green | 364/822 |
| 4,390,247 | 6/1983 | Freyre | 350/358 |
| 4,445,141 | 4/1984 | Benton et al. | 350/162.12 |
| 4,448,494 | 3/1984 | Freyre | 350/358 |
| 4,460,250 | 7/1984 | Freyre | 350/358 |
| 4,503,388 | 3/1985 | Zehl et al. | 324/77 K |
| 4,522,466 | 6/1985 | Lindis et al. | 364/822 X |
| 4,531,196 | 7/1985 | Lin | 364/822 X |
| 4,633,170 | 12/1986 | Burns | 324/77 K |
| 4,636,718 | 1/1987 | Labram | 324/77 K |
| 4,645,300 | 2/1987 | Brandstetter | 350/162.12 |

OTHER PUBLICATIONS

M. H. Brienza, "Variable Time Compression, Expansion, and Reversal of RF Signals by Laser-Acoustic Techniques," Applied Physics Letters, vol. 12, No. 5, Mar. 1, 1968, pp. 181-184.

Primary Examiner—Joseph Ruggiero
Assistant Examiner—Charles B. Meyer
Attorney, Agent, or Firm—Pollock, VandeSande & Priddy

[57] ABSTRACT

Amplitude equalization of a distorted multifrequency signal is accomplished by acousto-modulating the signal with a coherent light beam and focusing a resultant image on a Fourier plane where the frequency components of the image are spatially distributed. A control array, positioned in the plane, contains adjacent elements having optical filtering properties variable with respect to each other thereby selectively altering the optical amplitude of each image frequency component passing through the elements. The resultant transformed image then undergoes conversion to an electrical signal having its amplitude equalized relative to the distorted input signal.

11 Claims, 1 Drawing Sheet

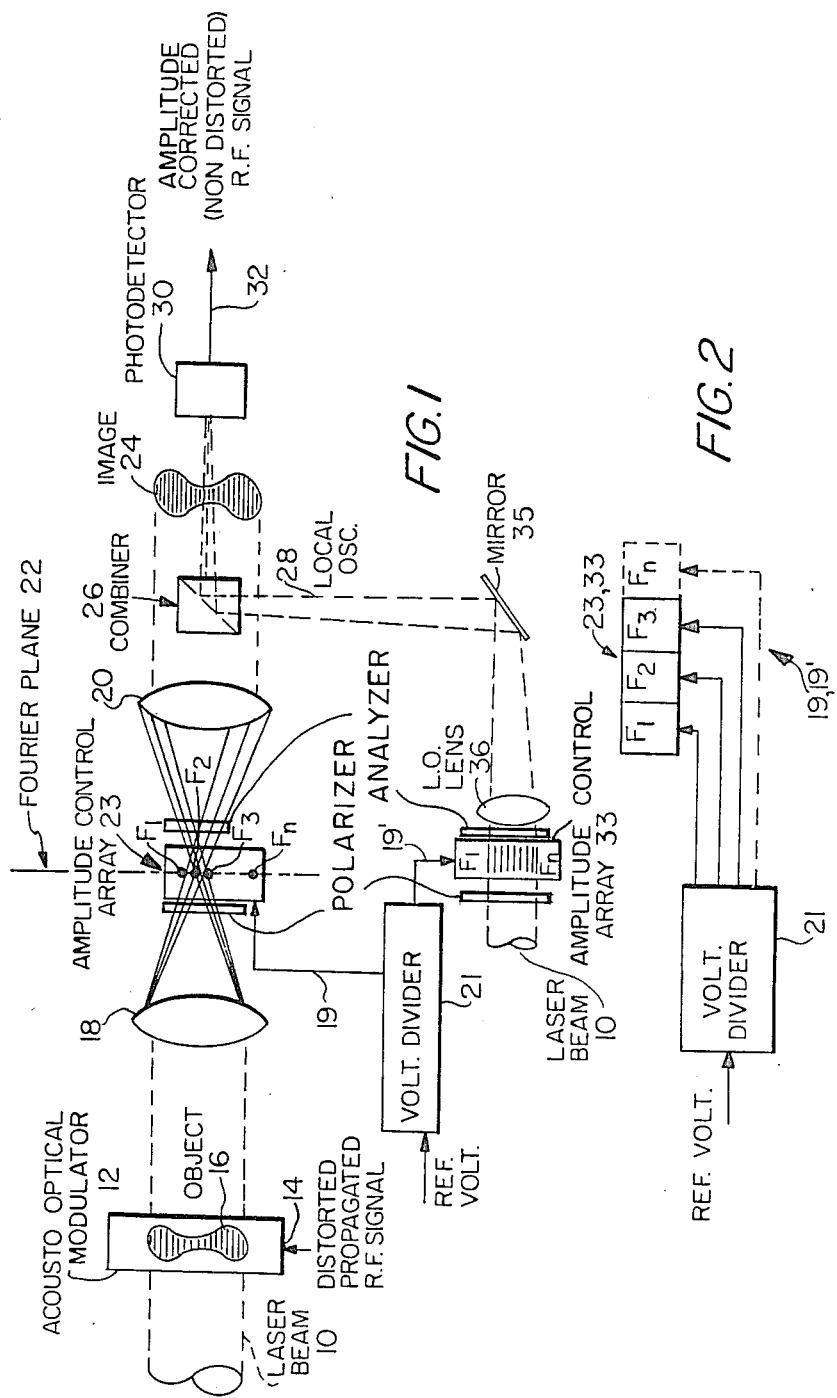

4,771,397

METHOD AND APPARATUS FOR OPTICAL RF AMPLITUDE EQUALIZATION

FIELD OF THE INVENTION

The present invention relates to amplitude equalization circuits, and more particularly to an optical circuit suited for RF signals.

BACKGROUND OF THE INVENTION

RF signals propagating through a medium generally experience non-linear amplitude characteristics, namely, different amplitude attenuations for different frequency components. Without special processing, such a propagated signal will be detected as a degraded signal.

The prior art has made wide use of impedance networks which introduce different attenuations to different frequency components of an RF signal, the components being summed at an output of the network so that attenuations of a propagated signal may be compensated, thus enabling the compensated signal to resemble the signal before propagation. As a result, information content of an original input signal may be preserved.

Prior art devices are severely restricted in the number of signal components that can be handled by the impedance elements and the speed with which the amplitude equalization is achieved. Further, such impedance elements can consume a substantial portion of the signal power, thereby adversely affecting the signal-to-noise ratio of the equalization circuitry.

BRIEF DESCRIPTION OF THE PRESENT INVENTION

The present invention utilizes coherent optical processing to perform amplitude equalization corrections of RF signals by providing amplitude equalization paths for a multitude of discrete signal frequency components in a parallel operation. By virtue of the present invention, one thousand or more discrete frequency components may be handled. As will be discussed hereinafter, the invention permits fixed or variable amplitude control for each of the frequency components which would not be possible by the prior art circuits.

After acousto-optical processing of a propagated distorted signal, an amplitude control array is introduced in a Fourier plane of the signal. The array is comprised of individual elements that have their optical filtering properties electrically altered and which correspondingly alter the amplitude of the particular frequency component associated with the element. The corrected optical signal then undergoes photoelectric transformation at a photomixer and the result is an amplitude-equalized correction signal which corresponds to an input signal prior to its propagation-induced amplitude distortion.

BRIEF DESCRIPTION OF THE FIGURES

The above-mentioned objects and advantages of the present invention will be more clearly understood when considered in conjunction with the accompanying drawings, in which:

FIG. 1 is a diagrammatic top plan view of an electro-optic apparatus for achieving the inventive concept;

FIG. 2 is a partial diagrammatic view of an amplitude control array as employed in the present invention.

DETAILED DESCRIPTION OF THE PRESENT INVENTION

A laser beam 10 serves as an optical carrier signal for a modulating RF signal 14 which has been previously distorted as a result of propagation. The beam 10 and RF signal 14 are introduced to a conventional acousto-optical modulator 12, such as the type manufactured by the ISOMET Corporation; and a modulated acoustic field (object) 16 is formed by modulator 12.

A Fourier plane 22 is developed between Fourier lens 18 and inverse Fourier lens 20. By introducing an amplitude control array 23 at the Fourier plane 22, the amplitude equalization capability of the present invention maay be realized. Specifically, there is a spatial frequency distribution of object 16 on the Fourier plane 22; and by placing a multi-optical element amplitude control array 23 in coplanar relationship with the spatial distribution, each frequency component of object 16, as spatially distributed, may undergo amplitude modification so that an amplitude-equalized optical signal results. As indicated, an optical polarizer and analyzer respectively precede and follow the array 23. Thus, as will be presently explained, the elements of the array produce desired amplitude control for each frequency component of the object 16.

To better understand the amplitude control array 23, reference is made to FIG. 2 wherein a multi-element electro-optic device is illustrated. The individual elements are schematically indicated by corresponding spatially distributed frequency components $F_1$-$F_n$. For purposes of simplicity, only a small number of frequency components is illustrated. However, it should be understood that the present invention is intended for a large number of frequency components, typically several thousand. Appropriate electro-optic devices include twisted nematic, liquid crystal devices, and the like. The purpose of each element in the array is to vary optical filtering of the spatially distributed frequency components, at the Fourier plane 22 in a manner that will equalize the amplitude of each frequency component as it passes through the Fourier plane 22. As a result, the amplitude of an image located to the right of the inverse Fourier lens 20 is amplitude equalized relative to the distorted object 16.

The equalized image undergoes processing by combiner 26 which may be a conventional semi-silvered mirror. A laser local oscillator beam 28 forms a second optical input to the combiner 26 to achieve optical heterodyning or down converting, thus forming the amplitude-equalized image 24 which impinges upon an intensity-sensitive square law photodetector 30 for transforming the amplitude-equalized image 24 to a corrected RF signal at photodetector output 32. As a result, the RF signal at ouput 32 is an amplitude-corrected signal resembling the original electrical signal which became amplitude distorted by propagation prior to introduction to the equalization circuitry of FIG. 1.

It should be pointed out that the amplitude equalization occurring at each of the elements in array 23 can be varied as propagation conditions change. The amount of filtering occurring through each cell is controlled by a device which, in its basic form, may resemble a voltage divider 21 to which a reference voltage is applied. Individual outputs from the voltage divider, as generally indicated by reference numeral 19 (FIG. 2) drive each element of the array to a degree corresponding with the desired optical filtering to be achieved by each element of the array 23.

The laser local oscillator beam 28, which forms the second optical input to the combiner 26 is derived from the laser beam 10. The local oscillator beam may be amplitude-controlled in a manner similar to that disclosed in connection with the signal path through the amplitude-control array 23. This is done by including a second amplitude-control array 33 similar in construction to the multi-optical element array 23 having the indicated optical polarizer and analyzer respectively positioned at either side of the array. As in the case of the first array 23, the second array 33 modifies the amplitude of the laser beam 10 as it impinges upon each element of the array. The lens 36 focusses the amplitude-modified beam for reflection by mirror 35 to form the local oscillator beam 28. In fact, this beam will be comprised of amplitude-modified sections which correspond to the amplitude modifications of object 16, as a result of array 23. The degree of elemental amplitude control is determined by the voltage divider output 19' in the same manner previously described in connection with voltage divider output 19, which drives the amplitude-control array 23.

The inclusion of an amplitude-modified local oscillator beam is not mandatory. However, the utilization of arrays 23 and 33 can be advantageously operated individually or in parallel to achieve amplitude correction of a distorted propagated RF signal over a wide range of applications.

In accordance with the present invention, phase correction may be accomplished in three modes:

1. utilization of amplitude-control array 23 and a local oscillator beam 28 which does not undergo phase control through array 33;
2. amplitude control of the local oscillator beam 28 by utilization of array 33 and no utilization of an amplitude-control array 23 at the Fourier plane 22; and
3. utilization of amplitude-control arrays 23 and 33.

Although the present invention illustrates a single pass device, if additional amplitude correction is required, multiple passes through the amplitude control array 23 may be accomplished by a recursive technique which may typically utilize mirrors (not shown) for achieving multiple passes.

Although the present invention has been described for RF signals, it is equally applicable to amplitude equalizing frequency components of other multi-frequency signals, regardless of the medium through which they propagate and encounter distortion.

Amplitude equalization of signal frequency components may be achieved by modifying the frequency components of the signal at the Fourier plane; additional amplitude equalization being possible by modifying the local oscillator beam. The means for so modifying the amplitude of individual frequency components is by utilizing arrays of birefringent elements as disclosed in our copending patent application entitled METHOD AND APPARATUS FOR OPTICAL RF PHASE EQUALIZATION.

It should be understood that the invention is not limited to the exact details of construction shown and described herein, for obvious modifications will occur to persons skilled in the art.

We claim:

1. A circuit for performing amplitude equalization on frequency components of an electrical signal, the circuit comprising:

means for modulating a coherent light beam with a multifrequency electrical input signal to form an image;
   means for forming a Fourier plane and spatially distributing the frequency components of the image on the plane;
   means located in the Fourier plane for controlling optical filtering at points in the plane thereby adjusting the amplitude of each distributed freqeuncy component to form a transformed image; and
   means for detecting the transformed image and forming an amplitude-equalized electrical output therefrom.

2. The circuit set forth in claim 1 wherein the modulating means comprises an acousto-optical modulator having:

an optical input communicating with a source of coherent light; and
   an electrical input terminal connected to the input signal.

3. The circuit set forth in claim 1 wherein the Fourier plane-forming means comprises:

a Fourier lens positioned forwardly of the plane; and
   an inverse Fourier lens positioned rearwardly of the plane.

4. The circuit set forth in claim 1 wherein the controlling means comprises:

an array of elements for selectively varying the optical filtering of each spatially distributed frequency component.

5. The circuit set forth in claim 1 wherein the detecting means comprises:

optical means for combining the transformed image and a local oscillator light beam for down-converting the transformed image; and
   a photodetector for changing the down converted image to an electrical signal which is amplitude equalized.

6. The circuit set forth in claim 2 wherein the controlling menas has an array of elements for selectively varying the optical filtering of each spatially distributed frequency component; and further wherein the detecting means includes:
   optical means for combining the transformed image and a local oscillator light beam for down-converting the transformed image, the local oscillator light beam being produced by a second array of elements for selectively varying the filtering of respective sections of the local oscillator light beam as the beam impinges upon the elements, thereby achieving amplitude control of the local oscillator beam sections; and
   a photodetector for changing the down converted image to an electrical signal which is amplitude equalized.

7. A circuit for performing amplitude equalization on frequency components of an electrical signal, the circuit comprising:

means for modulating a coherent light beam with a multifrequency electrical input signal to form an image;
   means for forming a Fourier plane and spatially distributing the frequency components of the image on the plane;
   means for combining the spatially distributed image with a local oscillator light beam for down converting the image;

photodetector means for changing the down converted image to an electrical signal which is amplitude equalized;

the local oscillator light beam being produced by means for selectively varying the optical filtering of different sections of the local oscillator light beam thereby effecting selective amplitude control of the local oscillator beam sections.

8. A method for performing amplitude equalization on frequency components of an electrical signal, the circuit comprising:

modulating a coherent light beam with a multifrequency electrical input signal to form an image;

forming a Fourier plane and spatially distributing the frequency components of the image;

controlling the optical filtering at points on the plane thereby adjusting the amplitude of each freqeuncy component and forming a transformed image; and detecting the transformed image and forming an amplitude-equalized electrical output therefrom.

9. The method set forth in claim 8 wherein controlling the filtering at each point on the plane includes the step of selectively changing the optical filtering at points on the plane.

10. The method set forth in claim 8 wherein detecting the transformed image includes the steps:

combining the transformed image and a local oscillator light beam for down converting the transformed image; and changing the down-converted image to an electrical signal which is amplitude equalized;

the local oscillator light beam produced by selectively varying the optical path of respective sections of the local oscillator light beam thereby achieving amplitude control of the oscillator beam sections; and detecting the down-converted image to produce a corresponding electrical signal which is amplitude equalized.

11. A method for performing amplitude equalization on frequency components of an electrical signal, the circuit comprising:

modulating a coherent light beam with a multifrequency electrical input signal to form an image;

forming a Fourier plane and spatially distributing the frequency components of the image;

combining the spatially distributed image with a local oscillator light beam for down converting the image; and changing the down-converted image to an electrical signal which is amplitude equalized;

the local oscillator light beam produced by selectively varying the optical filtering of respective sections of the local oscillator light beam thereby achieving amplitude control of the local oscillator beam sections.

* * * * *

UNITED STATES PATENT AND TRADEMARK OFFICE
CERTIFICATE OF CORRECTION

PATENT NO. : 4,771,397
DATED : September 13, 1988
INVENTOR(S) : Robert W. Brandstetter, et al.

It is certified that error appears in the above-identified patent and that said Letters Patent is hereby corrected as shown below:

Column 2, line 15, change "maay" to --may--.

Column 2, line 56, change "ouput" to --output--.

Column 4, line 9, change "freqeuncy" to --frequency--.

Column 4, line 40, change "menas" to --means--.

Column 5, line 20, change "freqeuncy" to --frequency--.

Signed and Sealed this

Fourteenth Day of February, 1989

Attest:

DONALD J. QUIGG

*Attesting Officer*   *Commissioner of Patents and Trademarks*